United States Patent
Roth et al.

(10) Patent No.: US 6,747,101 B2
(45) Date of Patent: Jun. 8, 2004

(54) EPOXY ACRYLATES

(75) Inventors: Martin Roth, Giffers (CH); Roger Salvin, Weil am Rhein (DE); Kurt Meier, Therwil (CH); Bernhard Sailer, Basel (CH); Rolf Wiesendanger, Riehen (CH)

(73) Assignee: Huntsman Advanced Materials Americas Inc., Salt Lake City, UT (US)

( * ) Notice: Subject to any disclaimer, the term of this patent is extended or adjusted under 35 U.S.C. 154(b) by 0 days.

(21) Appl. No.: 08/268,094

(22) Filed: Jun. 28, 1994

(65) Prior Publication Data

US 2004/0072969 A1 Apr. 15, 2004

(30) Foreign Application Priority Data

Jul. 2, 1993 (CH) .............................................. 2003/93

(51) Int. Cl.$^7$ ........................... C08G 59/17; C08L 63/10
(52) U.S. Cl. ........................ 525/531; 522/14; 522/100
(58) Field of Search .......................... 430/280.1, 285.1, 430/287.1; 525/531, 913, 922; 528/103, 112; 549/515; 522/14, 100

(56) References Cited

U.S. PATENT DOCUMENTS

| | | | | |
|---|---|---|---|---|
| 3,373,075 A | * | 3/1968 | Fekete et al. | 525/922 |
| 3,676,524 A | * | 7/1972 | Takiyama et al. | 525/922 |
| 3,936,366 A | | 2/1976 | Green | 204/159.23 |
| 4,074,008 A | * | 2/1978 | Green | 428/418 |
| 4,359,370 A | * | 11/1982 | De La Mare et al. | 528/112 |
| 4,595,734 A | * | 6/1986 | O'Hearn | 525/922 |
| 4,623,701 A | | 11/1986 | Massingill | |
| 4,735,891 A | | 4/1988 | Budde et al. | 430/313 |
| 4,789,620 A | * | 12/1988 | Sasaki et al. | 430/280 |
| 4,925,773 A | * | 5/1990 | Miyamura et al. | 525/922 |
| 5,069,956 A | * | 12/1991 | Murata et al. | 428/216 |
| 5,157,078 A | * | 10/1992 | Woo et al. | 525/531 |
| 5,218,061 A | * | 6/1993 | Kajiwara et al. | 525/523 |
| 5,319,060 A | * | 6/1994 | Nishikawa et al. | 525/922 |
| 5,942,371 A | | 8/1999 | Salvin et al. | 430/287.1 |

FOREIGN PATENT DOCUMENTS

| | | |
|---|---|---|
| EP | 0273729 | 7/1988 |
| EP | 0292219 | 11/1988 |
| EP | 0321824 | 6/1989 |
| EP | 0418011 | 3/1991 |
| JP | 1195056 | 7/1989 |
| JP | 5-32746 A * | 2/1993 |
| WO | 8907785 | 8/1989 |

OTHER PUBLICATIONS

Journal of Applied Polymer Sci., vol., 19 pp 609–617 (1975).
Derwent Abst 89–232343.
Derwent Abst 89–186235.

* cited by examiner

*Primary Examiner*—Robert Sellers
(74) *Attorney, Agent, or Firm*—Proskauer Rose LLP; Tiffany A. Levato; Kristin H. Neuman

(57) ABSTRACT

Epoxy acrylates and carboxyl group-containing epoxy acrylates of formulae III and IV of the claims that are relatively polymolecular and are chemically crosslinkable can be used in photoresist formulations with the additional use of highly polymerized polymer binders. Such resist formulations are used in particular in the field of printed circuit boards and printing plates, are applicable from aqueous medium, are almost tack-free and have very good edge coverage, especially on conductors.

38 Claims, No Drawings

EPOXY ACRYLATES

The present invention relates to epoxy acrylates of higher molecular weight and to carboxyl group-containing epoxy acrylates of higher molecular weight, to the preparation thereof, to the use of said epoxy acrylates in photoresist formulations, and to the use of said formulations, in particular in the field of printed wiring boards, typically as solder resists or as primary resists (etch resists or galvanoresists), and of printing plates.

Epoxy acrylates are known in abundance and are also used, inter alia, in compositions used as photoresist formulations.

Formulations for solder resists that contain reaction products of epoxy novolak resins with acrylic acid and cyclic carboxylic anhydrides are disclosed, inter alia, in EP 0 273 729. They are developable in aqueous alkaline media and have good thermal resistance and photosensitivity. Their resistance to chemicals, however, is unsatisfactory.

EP 0 418 011 discloses compositions for solder mask that are likewise based on reaction products of epoxy cresol novolaks with acrylic acid and cyclic dicarboxylic anhydrides, using 0.4 to 0.9 equivalent of acrylic acid per equivalent of epoxy group, such that the final product simultaneously contains acid and epoxy groups in the same molecule. A second thermal crosslinking reaction between these two functionalities is thereby made possible in the application of these resist compositions. The problem here is, however, aside from the preparation of the products (danger of gelation in the reaction with the anhydride), the storage stability, as the formulation containing such reaction products has a certain reactivity even at room temperature. All these cited epoxy acrylates are quite generally relatively low-molecular.

Photochemically or thermally cured epoxy acrylates that are derived from low molecular epoxy resins and epoxy novolaks are known for their good thermal and mechanical properties as well as for their good resistance to aggressive chemicals. However, the tackiness and edge coverage of the resist films obtained with these systems on conductors owing to the fairly low relative molar mass are unsatisfactory. In practical application it is therefore often necessary to avoid these shortcomings by adding highly polymerised polymer binders. Such binders normally contain no functional acrylate groups and do not react concurrently during the photochemical or thermal cure, i.e. they are not incorporated as "passive" components in the network and therefore result in a dilution of the network density, which, in turn, adversely affects in particular the resistance to chemicals and the electrical properties of processed resist layers. Furthermore, the photosensitivity decreases as a consequence of the "dilution" of the acrylate groups. The addition of highly polymerised polymer binders induces high viscosity of these formulations even if the solids content is relatively low and therefore often results in serious problems in coating.

It is therefore the object of this invention to provide acrylates that do not have the shortcomings referred to above.

This object is achieved in the practice of this invention by epoxy acrylates and novel carboxyl group-containing epoxy acrylates of higher molecular weight, which, when used in resist formulations, are able to function without or with only minor amounts of additional polymer binders. They are obtained by reaction of so-called "postglycidylated" epoxy resins (PGER) with, typically, (meth)acrylic acid.

Batzer and Zahir (J. Appl. Polym. Sci., 19, 609 (1975)) describe the postglycidylation of a low molecular liquid diglycidyl ether of bisphenol A. U.S. Pat. No. 4,623,701 discloses postglycidylated epoxy resins and the cure thereof with various epoxy hardeners; and U.S. Pat. No. 4,074,008 discloses photocrosslinked epoxy resins containing more than 2 epoxy groups in the molecule, at least 2 of which originate from a postglycidylation reaction. The photocrosslinkable groups in the molecular chain constitute α,β-unsaturated carbonyl systems (chalcone groups). Derivatives containing (meth)acrylyl groups are not described therein.

It is also known that the photosensitivity of an α,β-unsaturated carbonyl system that is photocrosslinkable by a 2+2-cycloaddition mechanism is substantially lower compared with the photopolymerisation of acrylates.

Japanese patent Kokai Hei 04-294352 discloses the modification of epoxy-novolak resins by reaction with an unsaturated monocarboxylic acid and subsequently with an unsaturated anhydride of a polycarboxylic acid and the use thereof in photosensitive aqueous formulations. Furthermore, European patent application 0 292 219 discloses photosensitive systems that contain epoxy compounds of bisphenol A that are modified with acrylic acid.

Specifically, the invention provides epoxy acrylates of formula III $$Q + O - A - O - CH_2 - \underset{OM}{\underset{|}{CH}} - CH_2O - T - OCH_2\underset{OM}{\underset{|}{CH}} - CH_2 \underset{n}{]} L \qquad (III)$$

wherein

Q is hydrogen or a group of formula

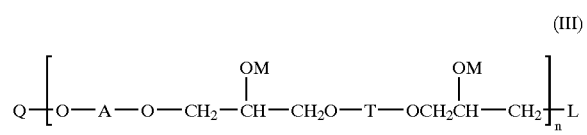

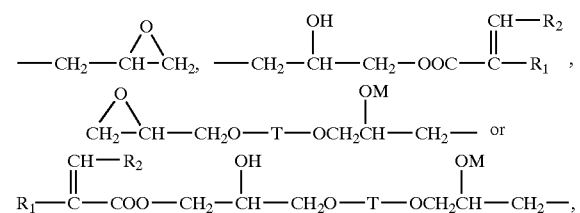

$R_1$ is —H or —$CH_3$, $R_2$ is —H, —$CH_3$ or phenyl
T is the radical of an aromatic bifunctional compound, and
M is each independently hydrogen or a group of formula

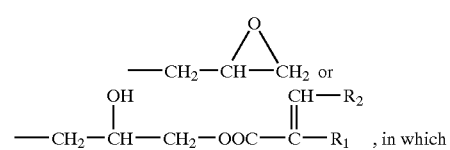

, in which $R_1$ and $R_2$ are as defined above,

A is the radical of an aromatic bifunctional compound,
n is an integer from 0 to 300, and
L is a group of formula

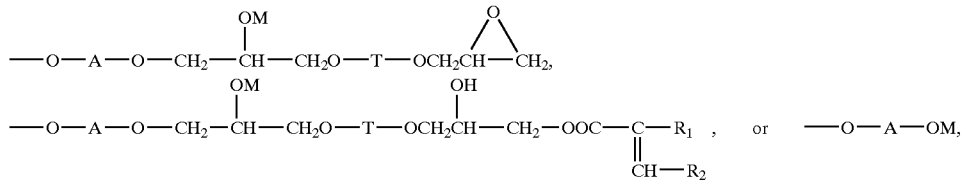

with the proviso that in formula III not all radicals M may simultaneously be hydrogen or a group of formula

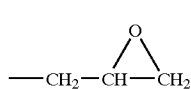

but at least 10 mol %, preferably 20–100 mol %, of the radicals M that are not present in the end groups Q and L denote a group of the formula

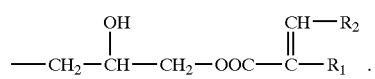

The epoxy acrylates of formula III are obtained by reacting a postglycidylated epoxy resin of formula II

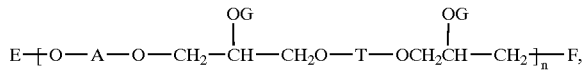

wherein

E is hydrogen or a group of formula

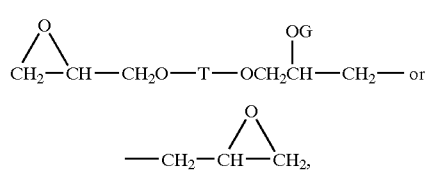

F represents the groups of formula —O—A—OG or

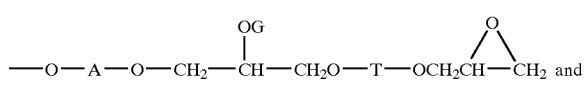

G is —H or the radical

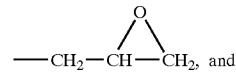

as in formula III, at least 10 mol % of the radicals G in formula II that are not present in the end groups E and F, represent the group of formula

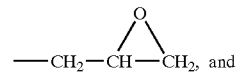

A, T, and n have the given meanings, with an ethylenically unsaturated monocarboxylic acid in the presence of a catalyst and a polymerisation inhibitor, at elevated temperature.

If n in formula III is 0, then Q is —H and L is the group of formula

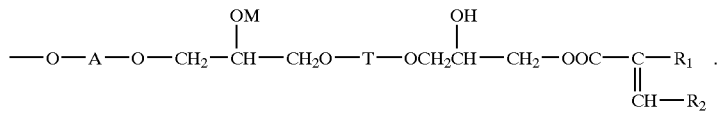

In preferred epoxy acrylates of formula III, n is an integer from 0 to 50, preferably from 0 to 30, and the symbols A and T have the preferred meanings of A and B given in Japanese patent Kokai Hei 1-195056.

Preferred bifunctional aromatic compounds A and T are linking groups of formulae

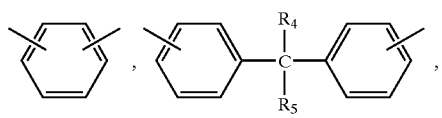

-continued

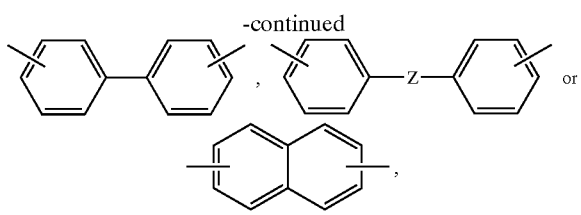

in which $R_4$ and $R_5$ are each independently of the other —H or $C_1$–$C_4$alkyl, Z is —S—, —O— or —$SO_2$, and the aromatic radicals of the linking group A or T are unsubstituted or substituted by halogen or $C_1$–$C_4$alkyl. $C_1$–$C_4$Alkyl is preferably —$CH_3$ and halogen is preferably bromo.

Particularly preferred linking groups A and T each independently of the other have the formula

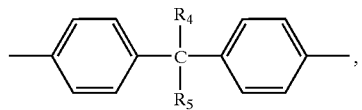

wherein $R_4$ and $R_5$ are as defined above and the phenyl radicals of the linking group are unsubstituted or substituted by bromo, and, preferably have the formulae

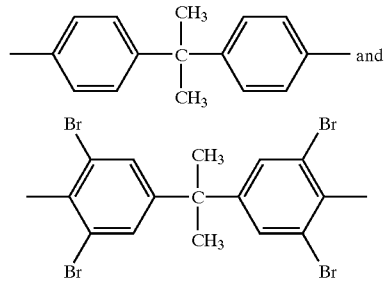

Throughout this specification, epoxy acrylates are taken to mean reaction products of epoxy compounds with (meth) acrylic acid.

Some of the postglycidylated epoxy resins of formula II are known and are prepared from the corresponding known advanced epoxy resins of formula I

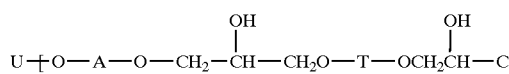
(I)

by a glycidylation reaction, wherein in formula I

U is hydrogen or the group of formula

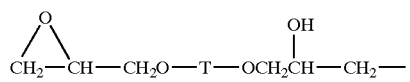

and

D is the group of formula

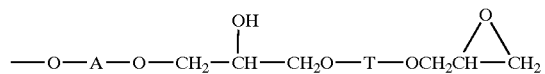

or the radical —O—A—OH, and the symbols A, T and n are as defined in connection with formula III.

The advanced epoxy resins of formula I on the other hand are obtained by known polyaddition of a bisphenol of formula

HO—A—OH to a diepoxy of formula

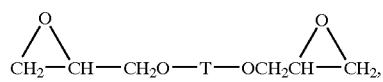

wherein A and T are the radical of a bifunctional aromatic compound.

The bisphenols HO—A—OH or HO—T—OH are preferably known bisphenols, more particularly bisphenol A and tetrabromobisphenol A, as well as those that are described in Japanese patent Kokai Hei 1-195056, preferably bisphenol A, bisphenol F, tetrabromobisphenol A and tetrabromobisphenol F.

To prepare the advanced epoxy resins, an excess of the above diepoxy is used, so that the advanced epoxy resins of formula I carry epoxy end groups. It is, however, also possible to use an excess of bisphenol HO—A—OH and thus to prepare molecules carrying phenolic end groups. The molecular weight is determined by the molar ratio of bisphenol HO—A—OH to the diepoxy. If desired, it is also possible to add minor amounts of higher functional phenols or epoxy compounds (e.g. trisphenols or triepoxyphenyl compounds) to the poly-addition. Specific amounts of starting materials (bisphenol HO—A—OH and/or diepoxy compound may also be present in the advanced epoxy resin.

The advanced epoxy resins of formula I contain secondary aliphatic hydroxyl groups resulting from the addition of the phenolic hydroxyl group to the oxirane ring

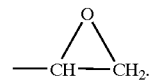

The glycidylation reaction to give the postglycidylated epoxy resins of formula II is carried out by known methods by reacting the advanced epoxy resin (I) with e.g. an excess of epichlorohydrin in the presence of a base (e.g. NaOH) and of a catalyst at elevated temperature.

The amount of base used in the glycidylation will depend on the desired degree of glycidylation. It is preferred to use 0.1 to 1.2 equivalents of base per equivalent of secondary HO group in the advanced epoxy resin. Water is removed by azeotropic distillation using excess epichlorohydrin as entrainer.

Particularly suitable catalysts are quaternary ammonium salts or phosphonium salts, typically including tetramethylammonium chloride, benzyltrimethylammonium chloride, benzyltriethylammonium chloride, tetraethylammonium chloride and tetrabutylammonium bromide.

The reaction temperature is conveniently in the range from 40 to 80° C., preferably from 50 to 65° C.

The aliphatic OH groups are partially or completely glycidylated by the glycidylation reaction.

The further reaction of the postglycidylated epoxy resins of formula II to the epoxy acrylates of formula III is likewise carried out in known manner by reaction with an ethylenically unsaturated monocarboxylic acid of formula

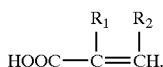

Suitable acids typically include crotonic acid, cinnamic acid and, preferably, acrylic acid or methacrylic acid or a mixture thereof. $R_1$ and $R_2$ are as defined above.

It is preferred to use a catalyst in the reaction. Particularly suitable catalysts are metal salts such as chromium compounds, amines such as triethylamine or benzyldimethylamine, also ammonium salts such as benzyltrimethylammonium chloride, or also triphenylphosphine and triphenylbismuth.

A solvent may be added to the reaction, as the postglycidylated epoxy resins of formula II are in the form of solids. However, the solvent must be inert to the educt. Suitable solvents include: ketones such as acetone, methyl ethyl ketone, cyclohexanone; esters such as ethyl and butyl acetate, ethoxyethyl acetate or methoxypropyl acetate; ethers such as dimethoxyethane and dioxane; aromatic hydrocarbons such as toluene, benzene and xylenes, as well as mixtures of two or more of these solvents.

The temperature will conveniently be in the range from 80 to 140° C., the reaction with acrylic acid being preferably carried out in the range from 80 to 120° C. and that with methacrylic acid preferably in the range from 80 to 140° C.

A polymerisation inhibitor may also be added to the reaction medium, suitably hydroquinone, hydroquinone monomethyl ether and 2,6-di-tert-butyl-p-cresol.

It is desirable to introduce air or a mixture of nitrogen/oxygen into the reaction medium, as some of the aforementioned polymerisation inhibitors are effective only in the presence of oxygen. Depending on the amount of ethylenically unsaturated monocarboxylic acid used, epoxy acrylates of formula III that are completely or only partially acrylated are obtained. The monocarboxylic acid can be used in equimolar amounts with respect to the epoxy groups or in less than equivalent amount. The completely reacted epoxy acrylates contain almost no more epoxy groups.

The epoxy acrylates of formula III need neither be isolated from the reaction medium nor purified. The reaction solution can be used direct as obtained in the synthesis.

The partially as well as the completely reacted products of formula III contain aliphatic hydroxyl groups originating from the reaction of the epoxy groups with the ethylenically unsaturated monocarboxylic acid. They may additionally contain aliphatic hydroxyl groups from the oil.

The completely acrylated epoxy acrylates of formula III can then be further reacted to carboxyl group-containing epoxy acrylates of formula IV

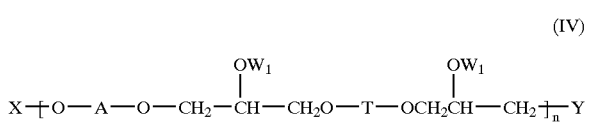

wherein

X is hydrogen or a group of formula

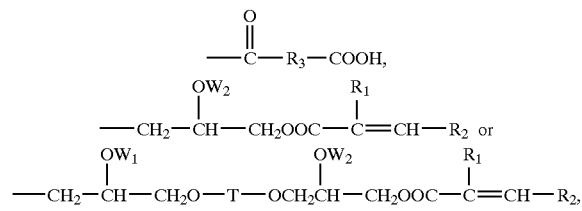

$R_3$ is the radical of a cyclic anhydride of a polycarboxylic acid after removal of the anhydride radical, $W_1$ is hydrogen or a group of formula

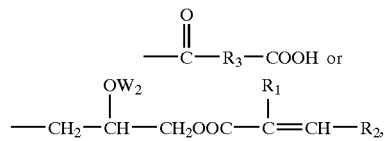

$W_2$ is —H or the group

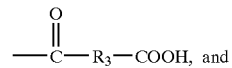

Y is the group of formula —O—A—O—$W_1$ or

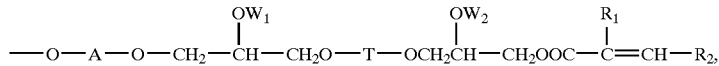

wherein the symbols A, T, $R_1$, $R_2$, $R_3$ and n have the given meanings, with the proviso that, in formula IV, at least 10 mol % of radicals $W_1$ that are not in the end groups X and Y are a group of formula

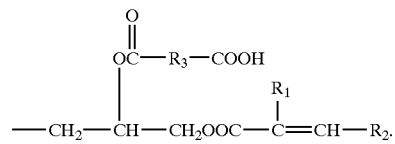

$R_1$, $R_2$ and $R_3$ have the given meanings.

As the completely reacted epoxy acrylates of formula III contain almost no more epoxy groups, they can be reacted with cyclic anhydrides of polycarboxylic acids. In this case, the aliphatic hydroxyl groups react with the cyclic anhydride to effect ring opening and hemiester formation. In this reaction, for each reacted hydroxyl group a carboxylic acid bonded to the resin forms. The reaction comprises reacting the epoxy acrylate of formula III with the cyclic anhydride, in the absence or presence of a catalyst and of a polymerisation inhibitor, at elevated temperature. The HO groups of the compounds of formula III are completely or partially acylated, accompanied by ring opening of the anhydride. It is therefore advantageous that the epoxy acrylates contain no more epoxy groups, otherwise gelation occurs. The anhydride is used in equimolar amounts with respect to the hydroxyl groups or in a less than equivalent amount. The reaction is known per se.

Suitable anhydrides of polycarboxylic acids typically include succinic anhydride, maleic anhydride, glutaric anhydride, tetrahydrophthalic anhydride, hexahydrophthalic anhydride, 3-methyl- and 4-methylhexahydrophthalic anhydride, 3-ethyl- and 4-ethylhexahydrophthalic anhydride, 3-methyl-, 3-ethyl-, 4-methyl- and 4-ethyltetrahydrophthalic anhydride, itaconic anhydride, phthalic anhydride, and trimellitic anhydride. Preferred anhydrides are succinic, tetrahydrophthalic, hexahydrophthalic and phthalic anhydride.

Suitable catalysts typically include amines such as triethylamine, benzyldimethylamine, pyridine or dimethylaminopyridine, or triphenylphosphine or metal salts such as chromium or zirconium compounds.

If desired, a solvent may be added to the reaction medium, as the epoxy acrylates of formula III are in the form of solids. The solvent must, however, be inert to the cyclic anhydride, so that hydroxyl group-containing solvents are not suitable. The solvents cited in connection with the reaction with the ethylenically unsaturated monocarboxylic acids may suitably be used.

The reaction temperature is conveniently in the range from 60 to 140° C., and suitable polymerisation inhibitors are typically hydroquinone, hydroquinone monomethyl ether and 2,6-di-tert-butyl-p-cresol.

It is desirable to introduce dry air or a mixture of nitrogen/oxygen into the reaction medium. In a preferred embodiment of the invention, the epoxy acrylates of formula III are further reacted, without isolation, in the same reactor to the derivatives of formula IV modified with carboxyl groups.

Isolation and purification of the novel carboxyl group-containing epoxy acrylates of formula IV is usually not necessary. The reaction solution can be further used as obtained in the synthesis.

Owing to the unsaturated groups present in the molecule, the epoxy acrylates of formula III and the carboxyl group-containing epoxy acrylates of formula IV are thermally and photochemically crosslinkable. They can therefore be used and applied as acrylate components in photoresist formulations for the production of solder resists or primary resists by known methods, as for example disclosed in Swiss patent application 2005/93-4, filed on Jul. $2^{nd}$, 1993, entitled "Photopolymerisable compositions" (the U.S. counterpart of which issued as U.S. Pat. No. 5,942,371 on Aug. 24, 1999), and give resist layers having enhanced thermal, mechanical, electrical and chemical properties. The resist formulations prepared therefrom are used in particular in the field of printed wiring boards as solder resists or primary resists, and of printing plates. They are also suitable for the production of offset printing plates, flexographic printing plates, book printing plates and screen printing formulations. Suitable developers are aqueous as well as aqueous-organic or organic systems. Owing to the presence of carboxyl groups in the compounds of formula IV, these systems are particularly suitable for the preparation of aqueous-alkaline developable photoresists.

The photoresist formulation of the present invention may contain as further components c): a (meth)acrylate monomer or (meth)acrylate oligomer or a vinyl compound that can be crosslinked with light; water; co-initiators; stabilizers; thermal hardeners in amounts of c. 1 to 20% by weight, e.g. N-methylolacrylamide, epoxy resins, blocked isocyanates and melamine resins; pigments or water-insoluble dyes in amounts of c. 0.1 to 2% by weight, e.g. Microlith blue 4G, Orasol blue GN and Irgalite green GLN; water compatible, organic and inorganic fillers in amounts of c. 5 to 15% by weight, e.g. talcum, quartz ($SiO_2$), barium sulfate ($BaSO_4$), aluminium oxide and calcium carbonate; additives in a total amount of c. 0.1 to 5% by weight, e.g. antifoams (e.g. Byk 80), adhesion promoters (e.g. benzotriazole), fungicides, thixotropic agents, and additionally up to 15% of an organic solvent such as methoxypropanol, methoxypropyl acetate and butyl glycol.

The (meth)acrylate monomer or oligomer, in an amount from 5 to 50% by weight, may be: 1) a mono(meth)acrylate; 2) a di(meth)acrylate; or 3) a poly(meth)acrylate having a functionality of at least 3.

Component 1) may be selected from the following compounds: allyl acrylate, allyl methacrylate, methyl(meth)acrylate, ethyl(meth)acrylate, n-propyl(meth)acrylate, n-butyl(meth)acrylate, isobutyl(meth)acrylate, n-hexyl (meth)acrylate, 2-ethylhexyl(meth)acrylate, n-octyl(meth) acrylate, n-decyl(meth)acrylate and n-dodecyl(meth) acrylate, 2-hydroxyethyl(meth)acrylate, 2- and 3-hydroxypropyl(meth)acrylate, 2-methoxyethyl acrylate, 2-ethoxyethyl acrylate and 2- or 3-ethoxypropyl acrylate, tetrahydrofurfuryl methacrylate, 2-(2-ethoxyethoxy)ethyl acrylate, cyclohexyl methacrylate, 2-phenoxyethyl acrylate, glycidyl acrylate and isodexyl acrylate. Such products are likewise known and some are commercially available, for example from the SARTOMER Company.

Component 2) may be selected from the diacrylate and dimethacrylate esters of aliphatic or cycloaliphatic diols, including 1,3-butylene glycol, 1,4-butanediol, neopentyl glycol, 1,6-hexanediol, diethylene glycol, triethylene glycol, tetraethylene glycol, polyethylene glycol 400, polyethylene glycol 600, tripropylene glycol, ethoxylated or propoxylated neopentyl glycol, 1,4-dihydroxymethylcyclohexane, 2,2-bis (4-hydroxycyclohexyl)propane or bis(4-hydroxycyclohexyl)methane, as well as the customary urethane acrylates, polyester acrylates or epoxy acrylates used for this purpose.

The following compounds may typically be used as component 3): 1,1,1-trimethylolpropane tri(meth)acrylate, ethoxylated 1,1,1-trimethylolpropane tri(meth)acrylate, pentaerythritol tetraacrylate, pentaerythritol monohydroxytri(meth)acrylate, dipentaerythritol monohydroxypenta(meth)acrylate. Such components are known and some are commercially available, as from the SARTOMER Company under the registered trademarks SR-295, SR-350, SR-35 1, SR-367, SR-399, SR-444 and SR-454, as well as the customery urethane acrylates, polyester acrylates or epoxy acrylates for this purpose.

Suitable vinyl compounds that are crosslinkable with light are N-vinylpyrrolidone or N-vinylcaprolactam.

Compared with low molecular epoxy acrylates in formulations that contain polymer binders, it is suprising that formulations containing epoxy acrylates of higher molecular weight without the addition of such polymer binders bring about an enhancement and not a loss of photosensitivity, and also that no increase in tackiness results. Furthermore, use of the formulations as solder resists results in improved edge coverage of the conductors. As no additional polymer binders are used in such formulations, further advantages accrue with respect to the thermal, mechanical and electrical properties and, in particular, to the resistance to chemicals of the resist compositions prepared therefrom. The novel epoxy acrylates of formula III and the carboxyl group-containing epoxy acrylates of formula IV have an increased glass transition temperature.

The invention is illustrated by the following non-limitative Examples.

PREPARATIVE EXAMPLES a) Postglycidylated epoxy Resins (PGER)

Example 1

The apparatus used is one suitable for tetramethylammonium chloride (TMAC) glycidylation reactions and which makes it possible to use excess epichlorohydrin as entrainer for the water separation under reduced pressure. The apparatus consists of a 5000 ml reactor equipped with stirrer, thermometer, an efficient multiple-coil condenser and 2 drip funnels with pressure equalisation. Connected to this apparatus are a water separator (for the upper aqueous phase and evacuation under vacuum) and a water jet pump with manometer. An oil bath is used for heating.

1000 g of epoxy resin Araldite GT 7004 (CIBA; (epoxy value 1.36 mol/kg of resin; HO number 2.71 mol) and 1700 ml (21.68 mol) of epichlorohydrin are dissolved in the reactor by heating. The homogeneous solution so obtained is heated to c. 80° C. and, with efficient stirring, the water jet vacuum is cautiously applied such that the epichlorohydrin refluxes vigorously. The temperature in the reactor falls and is set to a constant temperature of c. 55° C. and kept thereat for the entire reaction. This initially requires a pressure of 110–120 mbar, which towards the end of the reaction may then have to be somewhat reduced. The oil bath temperature is a constant 105–110° C. When the epichlorohydrin refluxes constantly at 55° C., 29.80 g (0.136 mol) of a 50% aqueous solution of tetramethylammonium chloride are added rapidly from the first drip funnel. Then 195.20 g (2.44 mol) of a 50% aqueous solution of sodium hydroxide are added dropwise over 2 hours from the second drip funnel and simultaneously the water of reaction and the epichlorohydrin resulting from the 50% solutions by azeotropic distillation are removed from the system. The internal temperature is kept at 55–58° C. and sufficient reflux is maintained to ensure rapid removal of the water from the reaction mixture. After the dropwise addition, the reaction mixture is kept for 2 hours at 55° C. while removing water from the system. The vacuum is discontinued and the suspension is neutralised by addition of crushed dry ice, followed by the addition of 10–20 ml of glacial acetic acid. After addition of 2000 ml of methoxypropyl acetate, the solvent and the epichlorohydrin are removed by distillation under reduced pressure. To the residue are added a further 2000 ml of methoxypropyl acetate and the resultant suspension is filtered over a filter aid (Hyflo), while scraping the surface of the filter bed from time to time. The clear, yellowish filtrate is concentrated on a rotary evaporator at a bath temperature of up to 120° C. The clear, yellow resin so obtained is diluted with methoxypropyl acetate to a solution of 50% solids content, affording 2316 g of an almost colourless 50% solution of the postglycidylated epoxy resin of formula II, wherein A is

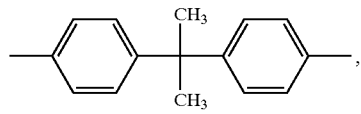

T is

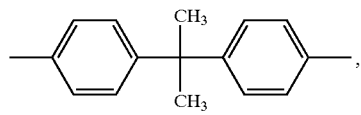

E is

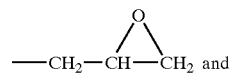

—CH$_2$—CH—CH$_2$ and

F is

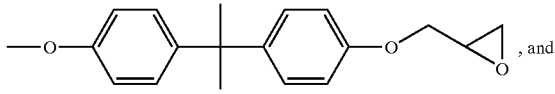

, and

G is c. 90 mol % of the group

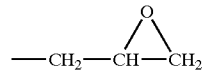

—CH$_2$—CH—CH$_2$ and 10 mol % of —H, and n has a mean value of 2.

This solution can be used direct for the reaction with acrylic acid. The analytical data obtained for this solution are:

| | | |
|---|---|---|
| 1. | analysis (solids content): | 49.5%; |
| 2. | epoxy value (titration): | 1.46 mol/kg/(→2.81 mol/kg solid resin); |
| 3. | Cl content (solid resin): | 0.40% Cl total; 0.23% Cl hydrolysable; |
| 4. | GPC (gel permeation chromatography polystyrene calibration | $M_w$ = 10678; $M_n$ = 2138. |

If it is desired to obtain the solid resin, methoxypropyl acetate can be replaced as solvent with methyl isobutyl ketone for diluting the resin when working up and the residue, after concentration in the rotary evaporator, can be poured hot into flat steel pans and dried under a high vacuum at 150° C. for several hours.

Example 2

Following the procedure described in Example 1, 555 g of Araldite GT 7004 (CIBA; (epoxy value 1.36 mol/kg of resin; HO number 1.50 mol), 705 ml of epichlorohydrin (9.00 mol), 16.40 g of a 50% aqueous solution of tetramethylammonium chloride and 66.00 g of a 50% aqueous solution of sodium hydroxide (0.83 mol) are reacted. After dropwise addition of the sodium hydroxide solution and further reaction for 45 min with separation of water, the bulk of the epichlorohydrin is removed by distillation under a vacuum of c. 85 mbar. Then 600 ml of methyl isobutyl ketone are added and the reaction mixture is neutralised with dry ice and acetic acid and diluted with a further 500 ml of methyl isobutyl ketone. The suspension is filtered over a filter aid (Hyflo), the solvent is stripped off on a rotary evaporator and the residue is poured hot into steel pans and dried under a high vacuum at 150° C. for several hours. The following analytical data are obtained for the yellowish solid resin (473 g):

| 1. epoxy value (titration): | 2.39 mol/kg resin; |
|---|---|
| 2. Cl content | 0.33% Cl total; |
|  | 0.17% Cl hydrolysable; |
| 3. OH number (titration): | 1.22 mol/kg; |
| 4. GPC (polystyrene calibration) | $M_w = 10721$; $M_n = 2330$. |

The solid resin conforms to formula II, wherein A and T as well as E, F and n have the meanings given in Example 1 and G is c. 55 mol % of the group

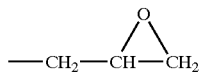

and 45 mol % of —H.

Example 3

Following the procedure described in Example 1, 525 g of Araldite B 41 (CIBA; epoxy value 2.66 mol/kg of resin; HO number 1.01 mol), 712 ml of epichlorohydrin (9.09 mol), 18.48 g of a 50% aqueous solution of tetramethylammonium chloride and 89.00 g of a 50% aqueous solution of sodium hydroxide (1.11 mol) are reacted and the product is isolated as a solid resin.

The analytical data obtained for the almost colourless solid resin (515 g) are:

| 1. epoxy value (titration): | 3.48 mol/kg; |
|---|---|
| 2. Cl content: | 0.21% Cl total; |
|  | <0.05% Cl hydrolysable; |
| 3. GPC (polystyrene calibration): | $M_w = 2374$; $M_n = 935$. |

The solid resin conforms to formula II, wherein T, E and F have the meanings given in Example 1, n is a mean value of c. 0.7 and G is 100 mol % of

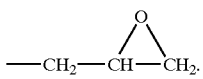

Example 4

Following the procedure described in Example 1, 435 g of Araldite GT 6071 (CIBA; epoxy value 2.18 mol/kg of resin; HO number 1.00 mol), 470 ml of epichlorohydrin (6.00 mol), 11.00 g of a 50% aqueous solution of tetramethylammonium chloride and 88.00 g of a 50% aqueous solution of sodium hydroxide (1.10 mol) are reacted and the product is isolated as a solid resin.

The analytical data obtained for the yellowish solid resin (390 g) are:

| 1. epoxy value (titration): | 3.55 mol/kg; |
|---|---|
| 2. Cl content: | 0.82% Cl total; |
|  | 0.60% Cl hydrolysable; |
| 3. GPC (polystyrene calibration): | $M_w = 6948$; $M_n = 1376$. |

The solid resin conforms to formula II, wherein A, T, E and F have the meanings given in Example 1, n is a mean value of c. 1.0 and G is 100 mol % of

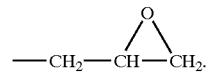

Example 5

Following the procedure described in Example 1, 1000 g of Araldite GT 6097 (CIBA; epoxy value 0.60 mol/kg of resin; HO number 3.175 mol), 1996 ml of epichlorohydrin (25.40 mol). 35.20 g of a 50% aqueous solution of tetramethylammonium chloride and 228.60 g of a 50% aqueous solution of sodium hydroxide (2.86 mol) are reacted and the product is isolated as a c. 50% solution in methoxypropyl acetate.

The analytical data obtained for this solution (2283 g) are:

| 1. solids content: | 48.30%; |
|---|---|
| 2. epoxy value (titration): | 1.17 mol/kg; |
| 3. Cl content: | 0.63% Cl total; |
|  | 0.30% Cl hydrolysable; |
| 4. GPC (polystyrene calibration): | $M_w = 16759$; $M_n = 3382$. |

The solid resin in the solution conforms to formula II, wherein A, T, E and F have the meanings given in Example 1, n is a mean value of c. 5.3 and G is 90 mol % of

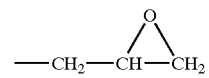

and 10 mol % of —H.

Example 6

Following the procedure described in Example 1, 500 g of Araldite GT 7097 (CIBA; epoxy value 0.58 mol/kg of resin; HO number 1.60 mol), 753 ml of epichlorohydrin (9.60 mol), 17.54 g of a 50% aqueous solution of tetramethylammonium chloride and 115.20 g of a 50% aqueous solution of sodium hydroxide (1.44 mol) are reacted and the product is isolated as a c. 45% solution in methoxypropyl acetate.

The analytical data obtained for this solution (1200 g) are:

| 1. solids content: | 44.50%; |
|---|---|
| 2. epoxy value (titration): | 1.19 mol/kg; |
| 3. Cl content: | 0.70 Cl total; |
|  | 0.45% Cl hydrolysable; |
| 4. GPC (polystyrene calibration): | $M_w = 23091$; $M_n = 4270$. |

The solid resin in the solution conforms to formula II, wherein A, T, E and F have the meanings given in Example 1, n is a mean value of c. 5.5 and G is 90 mol % of

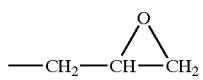

and 10 mol % of —H.

Example 7

Following the procedure described in Example 1, 400 g of Araldite GT 6099 (CIBA; epoxy value 0.41 mol/kg of resin; HO number 1.32 mol), 1038 ml of epichlorohydrin (11.88 mol), 14.08 g of a 50% aqueous solution of tetramethylammonium chloride and 95.04 g of a 50% aqueous solution of sodium hydroxide (1.19 mol) are reacted and the product is isolated as a c. 45% solution in methoxypropyl acetate.

The analytical data obtained for this solution (915 g) are:

| | |
|---|---|
| 1. solids content: | 45.60%; |
| 2. epoxy value (titration): | 1.16 mol/kg; |
| 3. Cl content: | 0.42% Cl total; |
| | 0.24% Cl hydrolysable; |
| 4. GPC (polystyrene calibration): | $M_w = 57017$; $M_n = 5604$. |

The solid resin in the solution conforms to formula II, wherein A, T, E and F have the meanings given in Example 1, n is a mean value of c. 8.0 and G is 90 mol % of

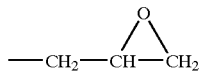

and 10 mol % of —H.

Example 8

Following the procedure described in Example 1, 1171 g of Araldite solid resin (CIBA; brominated epoxy resin; epoxy value 1.85 mol/kg of resin; HO number 2.26 mol), 1416 ml of epichlorohydrin (18.10 mol), 24.80 g of a 50% aqueous solution of tetramethylammonium chloride and 162.60 g of a 50% aqueous solution of sodium hydroxide (2.03 mol) are reacted and the product is isolated as a solid resin.

The analytical data obtained for this solid resin (1050 g) are:

| | |
|---|---|
| 1. epoxy value (titration): | 2.40 mol/kg; |
| 2. Cl content: | 0.45% Cl total; |
| | 0.22% Cl hydrolysable; |
| 3. GPC (polystyrene calibration): | $M_w = 3189$; $M_n = 1235$. |

The solid resin conforms to formula II, wherein

A is 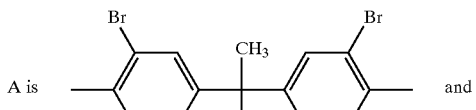 and

T is 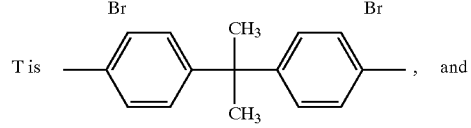, and

E and F are as defined in Example 1 n is c. 1.0 and

G is 90 mol % of

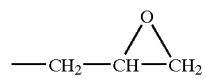

and 10 mol % of —H.

b) Partially or Complete Acrylated Epoxy Acrylates of PGER

Example 9

The apparatus used consists of a 5000 ml reactor equipped with stirrer, drip funnel, thermometer, reflux condenser and an inlet pipe for air. To inhibit the polymerisation of the acrylates, a weak flow of air is introduced during the reaction below the surface. Heating is carried out with a thermostatically controlled oil bath. The reactor is charged with 2316.5 g of a 45% solution (in methoxypropylacetate) of the reaction product of Example 1 (2.965 mol of epoxy groups), 3.80 g of hydroquinone monomethyl ether and 5.20 ml of triethylamine. With stirring, the reaction mixture is heated to 95° C. While introducing a weak stream of air, 213.70 g of acrylic acid (2.965 mol) are added over 1 hour at 95° C. and the reaction mixture is kept for 25 hours at this temperature. The reaction is monitored by measuring the epoxy value; upon completion of the reaction it is less than 0.08 mol/kg. The reaction product is cooled and further used without additional purification.

| | |
|---|---|
| 1. solids content: | 54%; |
| 2. acid number (titration): | 0.03 mol/kg; |
| 3. viscosity (Brookfield) 25° C. | 1970 mPa · s; |
| 4. GPC (polystyrene calibration): | $M_w = 8889$; $M_n = 2256$. |

The solid resin conforms to formula III, wherein A and T have the meanings given in Example 1.

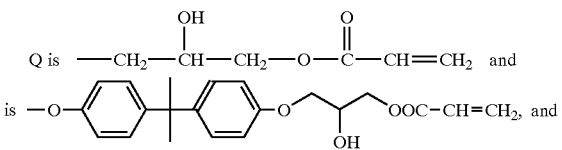

n has a value of c. 2.0 and

M is 90 mol % of

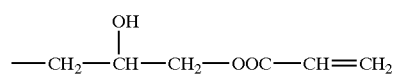

and 10 mol % of —H.

Example 10

The apparatus used consists of a 2000 ml reactor equipped with stirrer, drip funnel, thermometer, reflux condenser and an inlet pipe for air. To inhibit the polymerisation of the acrylates, a weak flow of air is introduced during the reaction below the surface. Heating is effected with a thermostatically controlled oil bath. The reactor is charged with the following components and stirred at room temperature until a homogeneous solution has been obtained: 1018.60 g of a 50% solution (in methoxypropyl acetate) of the reaction product of Example 1 (1.422 mol of epoxy groups titrated); 102.46 g of acrylic acid (1.422 mol); 1.53 g of hydroquinone monomethyl ether; 20.38 ml of a 10% solution (in methoxypropyl acetate) of Nuosynchromium 5 (ex HARCROS, Durham Chemicals, Durham DH3 1QX, GB).

The reaction mixture is heated to 110° C. and kept at this temperature with stirring and while introducing a weak flow of air for 7 hours. The reaction course is monitored by acid or epoxy titration. The acid titration number is 0.5 mov/kg after 7 hours. After cooling, the reaction product is drawn off and further used without purification. The analytical data obtained for the reaction product (1080 g) are:

| | |
|---|---|
| 1. solids content: | 53.3%; |
| 2. epoxy value (titration): | 0.02 mol/kg; |
| 3. GPC (polystyrene calibration): | $M_w$ = 12168; $M_n$ = 2602. |

The solid resin conforms to the chemical structure of Example 9.

Example 11

The apparatus (500 ml reactor) as described in Example 10 is used. Following the procedure described in Example 10, 200 g of a 50% solution (in methoxypropyl acetate) of the reaction product of Example 1 (0.292 mol of epoxy groups), 10.52 g of acrylic acid (0.146 mol), 0.33 g of hydroquinone monomethyl ether and 20.00 ml of a 1% solution (in methoxypropyl acetate) of Nuosynchromium 5 are reacted. The reaction is terminated after 3 hours at 100° C. The acid titration then gives <0.02 mol/kg. The analytical data obtained for the reaction product (210 g) are:

| | |
|---|---|
| 1. solids content: | 46%; |
| 2. epoxy value (titration): | 0.71 mol/kg; |
| 3. GPC (polystyrene calibration): | $M_w$ = 11036; $M_n$ = 2352. |

The solid resin conforms to formula III, wherein A and T are as defined in Example 1, Q is 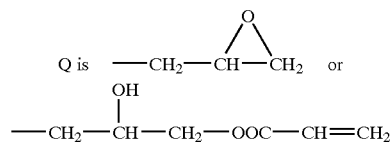

L is 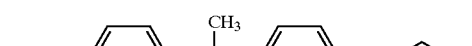

and n is 2, and
M is 90 mol % of

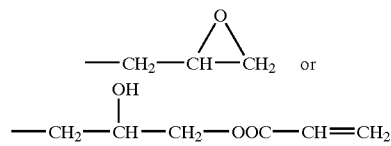

and 10 mol % of —H.

Example 12

The apparatus of Example 11 is used. Following the procedure described in Example 10, 200 g of a 50% solution (in methoxypropyl acetate) of the reaction product of Example 5 (0.236 mol of epoxy groups), 17.00 g of acrylic acid (0.236 mol), 0.33 g of hydroquinone monomethyl ether and 0.54 g of triphenylphosphine are reacted. The reaction is terminated after 14 hours at 100° C. The acid titration then gives 0.09 mol acid/kg. The analytical data obtained for the reaction product (210 g) are:

| | |
|---|---|
| 1. solids content: | 54%; |
| 2. epoxy value (titration): | 0.10 mol/kg; |
| 3. GPC (polystyrene calibration): | $M_w$ = 19493; $M_n$ = 3075. |

The solid resin conforms to formula III, wherein A and T are as defined in Example 1, and Q, L and M are as defined in Example 9, and n is c. 5.3.

Example 13

The apparatus described in Example 11 is used. Following the procedure described in Example 10, 100 g of a 48.3% solution (in methoxypropyl acetate) of the reaction product of Example 5 (0.117 mol of epoxy groups), 8.85 g of acrylic acid (0.123 mol), 0.15 g of hydroquinone monomethyl ether and 1.15 ml of a 10% solution (in methoxypropyl acetate) of Nuosynchromium 5 are reacted. The reaction is complete after 7 hours at 110° C. The acid titration then gives 0.06 mol/kg. The analytical data obtained for this reaction product (210 g) are:

| epoxy value (titration): | 0.020 mol/kg. |

The product conforms to the formula of Example 12.

Example 14

The apparatus (1000 ml) described in Example 10 is used. Following the procedure described in Example 10, 720 g of a 50% solution (in methoxypropyl acetate) of the reaction product of Example 5 (0.828 mol of epoxy groups), 29.83 g of acrylic acid (0.414 mol), 1.11 g of hydroquinone monomethyl ether and 37.00 ml of a 2% solution (in methoxypropyl acetate) of Nuosynchromium 5 are reacted. The reaction is complete after 5 hours at 100° C. The acid titration then gives <0.02 mol acid/kg. The analytical data obtained for this reaction product are:

| 1. solids content: | 50.3%; |
| 2. epoxy value (titration): | 0.65 mol/kg; |
| 3. GPC (polystyrene calibration): | $M_w$ = 38840; $M_n$ = 4226. |

The solid resin conforms to formula III, wherein A and T are as defined in Example 1, and Q, L and M are as defined in Example 11, and n is c. 5.3.

c) Carboxyl Group-containing Epoxy Acrylates of Completely Acrylated PGER

Example 15

The apparatus used consists of a 5000 ml reactor equipped with stirrer, thermometer, reflux condenser and an inlet pipe for air. To inhibit the polymerisation of the acrylates, a weak flow of air is introduced during the reaction below the surface. Heating is carried out with a thermostatically controlled oil bath. The reactor is charged with 2171 g of the reaction product of Example 9 (2.61 mol of OH groups) and, with stirring, 196.08 g of succinic anhydride (1.96 mol) are added. Then 7.4 ml of benzyldimethylamine are added and the reaction mixture is heated to 110° C. while introducing a flow of dry air and kept at this temperature for 4 hours. Then a further 7.4 ml of benzyldimethylamine are added and stirring is continued for 4 hours at this temperature.

The homogeneous yellowish reaction product is cooled and further used without additional purification. The following analytical data are obtained for this reaction product:

| 1. solids content: | 55%; |
| 2. acid number (titration): | 0.88 mol/kg; |
| 3. GPC (polystyrene calibration): | $M_w$ = 8525; $M_n$ = 2237. |

The solid resin conforms to formula IV, wherein A and T have the meanings given in Example 1, and

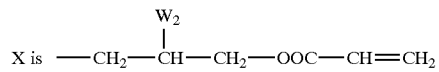

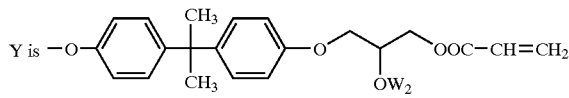

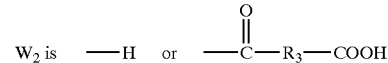

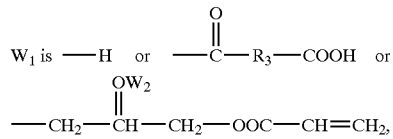

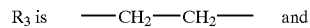

n is 2.0.

Example 16

The apparatus (500 ml) as described in Example 15 is used. The reactor is charged with the reaction product of Example 13 (0.117 ml OH groups) and 5.854 g of succinic anhydride (0.0585 mol), and the mixture is heated to 110° C. and kept at this temperature for 7 hours while introducing a weak flow of air. The homogeneous reaction product is further used without additional purification. The following analytical data are obtained for this reaction product:

| 1. solids content: | 61.7%; |
| 2. acid number (titration): | 0.66 mol/kg. |

The solid resin conforms to the structure of Example 15 and n is c. 5.3.

APPLICATION EXAMPLES

General Procedure

The coating substrates used are cleansed copperclad electronic laminates or processed printed circuit boards with conductive pattern. The resist formulations are prepared by mixing and dissolving the components listed in the Examples, followed by optional filtration. All operations are carried out under protective yellow light.

For test purposes, the formulations can be coated on to the printed circuit board with a wire applicator. For larger series, curtain coating methods or roller coating as well as screen printing are used.

Drying is carried out in a circulating air oven. Exposure is made using a commercial apparatus with 5000 W mercury high-pressure radiation source doped with metal halide. Development is carried out in commercial continuous development apparatus. Assessment of photosensitivity and resolution is made by exposure through a Stouffer step wedge and resolution wedge and the result is evaluated from the developed resist image.

Application Example

Formulation 1.1 comprises a novel acrylate modified with carboxyl groups:

| | |
|---|---|
| 53.00 g | of the reaction product of Example 15 (as 55% solution in methoxypropyl acetate); |
| 19.00 g | of CN 965 (acrylate sold by Craynor); |
| 3.00 g | Irgacure 907 (2-methyl-1-[4-(methylthio)phenyl]-2-morpholino-propane-1) (photoinitiator; CIBA AG, Basel); |
| 1.50 g | Quantacure ITX (isopropylthioxanthone; sensitiser); |
| 0.15 g | Orasol blue GN (dye sold by CIBA AG, Basel); |
| 28.95 g | methoxypropyl acetate. |

Formulation 1.2: Comparison Example with a highly polymerised binder and without novel acrylate:

| | |
|---|---|
| 97.20 g | of Scripset 550E solution (30% solution in methoxypropyl acetate; polymer binder sold by Monsanto; styrene/maleic acid copolymer); |
| 19.00 g | of CN 965; |
| 3.00 g | of Irgacure 907; |
| 1.50 g | of Quantacure ITX; |
| 0.15 g | of Orasol blue GN. |

Result:

| | Formulation 1.1 | Formulation 1.2 |
|---|---|---|
| solids content | 50% | 43.7% |
| viscosity 25° C. (Epprecht) | 600 mPa · s | 7600 mPa · s |
| dry layer thickness | 12 μm | 12 μm |
| drying conditions | 5 min. 80° C. | 5 min. 80° C. |
| exposure | 150 mJ/cm² | 150 mJ/cm² |
| development | 1% Na-carbonate 35° C. | 1% Na-carbonate 35° C. |
| last visible wedge step | 6 | no image: developed away |

Formulation 1.1 containing the acrylate has a significantly lower viscosity than formulation 1.2, despite the substantially higher solids content. In addition, the photosensitivity (Stouffer wedge step 6) is much higher compared with formulation 1.2 (a too low sensitivity to produce an image).

What is claimed is:

1. A photoresist formulation consisting of:

(a) an epoxy acrylate of formula III $$Q\text{-}\!\left[\text{O-A-O-CH}_2\text{-}\overset{\text{OM}}{\underset{|}{\text{CH}}}\text{-CH}_2\text{-O-T-O-CH}_2\text{-}\overset{\text{OM}}{\underset{|}{\text{CH}}}\text{-CH}_2\right]_n\!\text{-L} \quad (\text{III})$$

wherein Q is hydrogen or a group of formula $$-\text{CH}_2-\underset{\diagdown\!\!\diagup}{\overset{\text{O}}{\text{CH-CH}_2}}, \quad -\text{CH}_2\text{CHCH}_2\text{OOC}-\overset{\text{CH}-R_2}{\underset{\|}{\text{C}}}-R_1,$$

$$\underset{\diagdown\!\!\diagup}{\overset{\text{O}}{\text{CH}_2\text{-CH}}}-\text{CH}_2-\text{O-T-O-CH}_2-\overset{\text{OM}}{\underset{|}{\text{CH}}}-\text{CH}_2-, \text{ or}$$

$$R_1-\overset{\text{CH}-R_2}{\underset{\|}{\text{C}}}-\text{COO-CH}_2-\overset{\text{OH}}{\underset{|}{\text{CH}}}-\text{CH}_2-\text{O-T-O-CH}_2-\overset{\text{OM}}{\underset{|}{\text{CH}}}-\text{CH}_2-,$$

wherein
$R_1$ is —H or —$CH_3$, and
$R_2$ is —H, —$CH_3$ or phenyl,

T is the radical of an aromatic bifunctional compound,
M is each independently hydrogen or a group of formula $$-\text{CH}_2\underset{\diagdown\!\!\diagup}{\overset{\text{O}}{\text{CHCH}_2}} \quad \text{or} \quad -\text{CH}_2\overset{\text{OH}}{\underset{|}{\text{CH}}}\text{CH}_2\text{OOC}-\overset{\text{CH}-R_2}{\underset{\|}{\text{C}}}-R_1,$$

in which
$R_1$ and $R_2$ are as defined above,
A is the radical of an aromatic bifunctional compound,
n is an integer from 0 to 300,
L is a group of formula $$-\text{O-A-O-CH}_2-\overset{\text{OM}}{\underset{|}{\text{CH}}}-\text{CH}_2-\text{O-T-O-CH}_2-\underset{\diagdown\!\!\diagup}{\overset{\text{O}}{\text{CH-CH}_2}},$$

$$-\text{O-A-O-CH}_2-\overset{\text{OM}}{\underset{|}{\text{CH}}}-\text{CH}_2-\text{O-T-O-CH}_2-$$
$$-\overset{\text{OH}}{\underset{|}{\text{CH}}}-\text{CH}_2-\text{OOC}-\overset{\text{CH}-R_2}{\underset{\|}{\text{C}}}-R_1$$

or

—O—A—OM, in which M, $R_1$ and $R_2$ are as defined above, with the proviso that in formula III not all radicals M may be simultaneously hydrogen or a group of formula $$-\text{CH}_2\underset{\diagdown\!\!\diagup}{\overset{\text{O}}{\text{CHCH}_2}}$$

but at least 10 mol % of the radicals M that are not present in the end groups Q and L are a group of the formula $$-\text{CH}_2\overset{\text{OH}}{\underset{|}{\text{CH}}}\text{CH}_2\text{OOC}-\overset{\text{CH}-R_2}{\underset{\|}{\text{C}}}-R_1,$$

and with the proviso that when n in formula III is 0, then Q is hydrogen and L is the group of formula $$-\text{O-A-O-CH}_2-\overset{\text{OM}}{\underset{|}{\text{CH}}}-\text{CH}_2-\text{O-T-O-CH}_2-$$
$$-\overset{\text{OH}}{\underset{|}{\text{CH}}}-\text{CH}_2-\text{OOC}-\overset{\text{CH}-R_2}{\underset{\|}{\text{C}}}-R_1$$

(b) a photoinitiator; and
   (c) optionally
   i) a (meth)acrylate monomer or (meth)acrylate oligomer or a vinyl compound that can be crosslinked with light;
   ii) water;
   iii) a Co-initiator;
   iv) a stabilizer;
   v) a thermal hardener;
   vi) a pigment or water-insoluble dye;
   vii) a water compatible organic or inorganic filler;
   viii) an antifoam agent;
   ix) an adhesion promotor;

x) a fungicide;
xi) a thixotropic agent; and
xii) an organic solvent.

2. The photoresist formulation of claim 1, wherein said epoxy acrylate of formula III is prepared by reacting
   (a) a postglycidylated epoxy resin of formula II

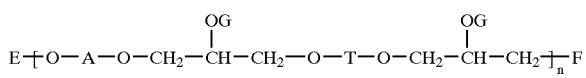
(II)

wherein E is hydrogen or a group of formula

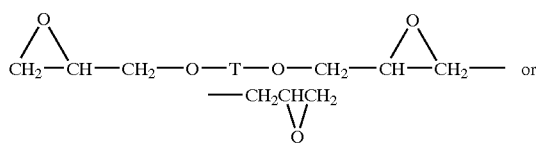

F represents the group of formula —O—A—OG or

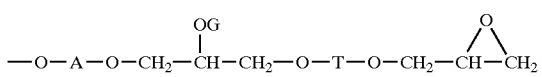

and
G is —H or the radical

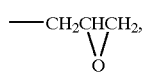

with the proviso that, in formula II, at least 10 mol % of the radicals G that are not present in the end groups E and F represent the group of formula

 and

A, T, and n are as defined in claim 1, with
   (b) an ethylenically unsaturated monocarboxylic acid, in the presence of a catalyst and a polymerisation inhibitor, at elevated temperature.

3. A photoresist formulation according to claim 1, wherein at least 20–100 mol % of the radicals M that are not present in the end groups Q and L of formula III are a group of the formula

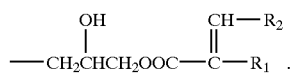

4. A photoresist formulation according to claim 1 or 2, wherein A and T are each independently of the other a linking group of the formulae

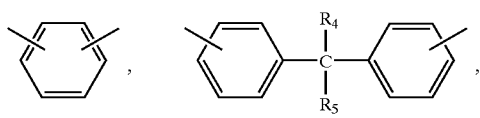

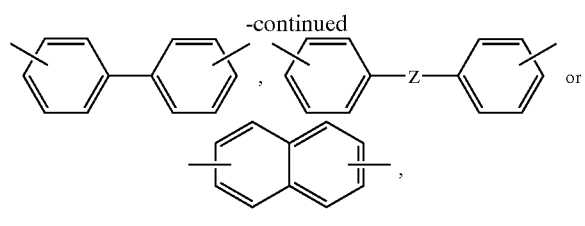

in which $R_4$ and $R_5$ are each independently of the other —H or $C_1$–$C_4$ alkyl; Z is —S—, —O—, or —SO$_2$—; and the phenyl radicals of said linking groups are unsubstituted or substituted by halogen or $C_1$–$C_4$ alkyl.

5. A photoresist formulation according to claim 1 or 2, wherein A and T are each independently of the other a linking group of formula

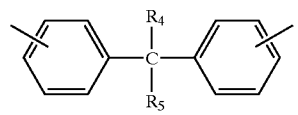

wherein $R_4$ and $R_5$ are each independently of the other —H or $C_1$–$C_4$ alkyl, and the phenyl radicals of said linking group are unsubstituted or bromine-substituted.

6. A photoresist formulation according to claim 5, wherein n is an integer from 0 to 50.

7. A photoresist formulation according to claim 5, wherein A and T are each independently of the other a linking group of formulae

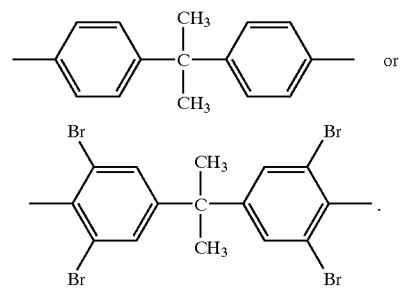

8. A photoresist formulation according to claim 2, wherein the ethylenically unsaturated monocarboxylic acid has the formula

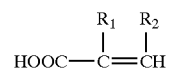

wherein $R_1$ and $R_2$ are defined as in claim 2.

9. A photoresist formulation according to claim 2, wherein the ethylenically unsaturated monocarboxylic acid is selected from the group consisting of crotonic acid, cinnamic acid, acrylic acid, methacrylic acid, and mixtures of any of the foregoing.

10. A photoresist formulation according to claim 9, wherein the ethylenically unsaturated monocarboxylic acid is selected from the group consisting of acrylic acid, methacrylic acid, and mixtures thereof.

11. A photoresist formulation according to claim 2, wherein said catalyst is selected from the group consisting of metal salts, amines, ammonium salts, triphenylphosphine and triphenylbismuth.

12. A photoresist formulation according to claim 11, wherein said catalyst is selected from the group consisting of chromium salts, triethylamine, benzyldimethylamine, and benzyltrimethylammonium chloride.

13. A photoresist formulation according to claim 2, wherein an inert solvent is used in the reaction and said solvent is selected from the group consisting of ketones, esters, ethers, aromatic hydrocarbons, and mixtures thereof.

14. A photoresist formulation according to claim 13, wherein the inert solvent is selected from the group consisting of acetone, methyl ethyl ketone, cyclohexanone, ethyl acetate, butyl acetate, ethoxyethyl acetate, methoxypropyl acetate, dimethoxyethane, dioxane, toluene, benzene, xylenes and mixtures of the foregoing.

15. A photoresist formulation according to claim 2, wherein the elevated temperature is in the range from 80 to 140° C.

16. A photoresist formulation according to claim 2, wherein the polymerisation inhibitor is selected from the group consisting of hydroquinone, hydroquinone monomethyl ether, and 2,6-di-tert-butyl-p-cresol.

17. A photoresist formulation according to claim 2, wherein air, or a mixture of nitrogen and oxygen, is introduced into the reaction medium.

18. A photoresist formulation according to claim 2, wherein the ethylenically unsaturated monocarboxylic acid is used in equimolar amounts with respect to the epoxy groups, or in less than equivalent amount.

19. A photoresist formulation according to claim 1, wherein the photoinitiator is 2-methyl-1-[4-(methylthio)phenyl]-2-morpholino-propane-1.

20. A method for the preparation of a photoresist formulation, consisting of the step of mixing (a) an epoxy acrylate of formula III

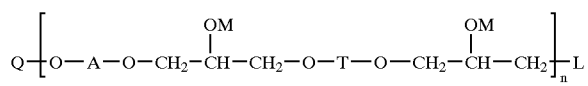

(III)

wherein Q is hydrogen or a group of formula

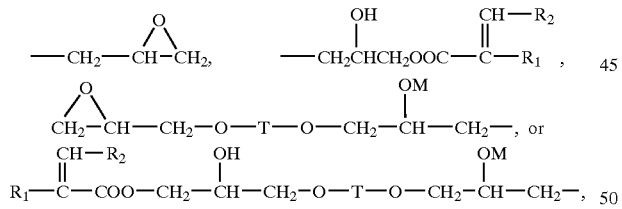

wherein
R$_1$ is —H or —CH$_3$, and
R$_2$ is —H, —CH$_3$ or phenyl,
T is the radical of an aromatic bifunctional compound,
M is each independently hydrogen or a group of formula

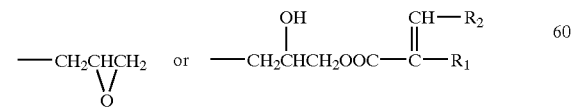

wherein R$_1$ and R$_2$ are as defined above,
A is the radical of an aromatic bifunctional compound,
n is an integer from 0 to 300, L is a group of formula

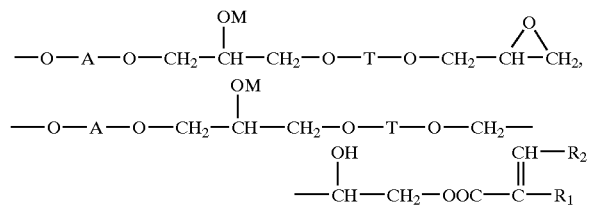

or

wherein M, R$_1$ and R$_2$ are as defined above,
with the proviso that in formula III not all radicals M may be simultaneously hydrogen or a group of formula

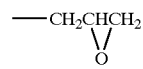

but at least 10 mol % of the radicals M that are not present in the end groups Q and L are a group of the formula

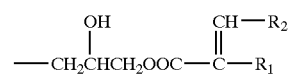

and with the proviso that when n in formula III is 0, then Q is —H and L is the group of formula

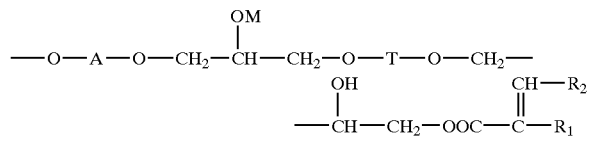

with
(b) a photoinitiator; and
(c) optionally
 i) a (meth)acrylate monomer or (meth)acrylate oligomer or a vinyl compound that can be crosslinked with light;
 ii) water;
 iii) a Co-initiator;
 iv) a stabilizer;
 v) a thermal hardener;
 vi) a pigment or water-insoluble dye;
 vii) a water compatible organic or inorganic filler;
 viii) an antifoam agent;
 ix) an adhesion promotor;
 x) a fungicide;
 xi) a thixotropic agent; and
 xii) an organic solvent.

21. The method of claim 20, wherein said epoxy acrylate of formula III is prepared by reacting (a) a postglycidylated epoxy resin of formula II (II)

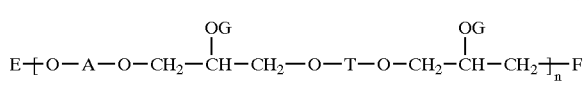

wherein
E is hydrogen or a group of formula

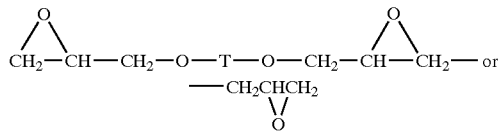

F represents the groups of formula —O—A—OG or

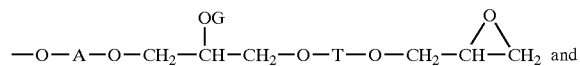

G is —H or the radical

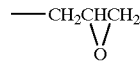

with the proviso that, in formula II, at least 10 mol % of the radicals G that are not present in the end groups E and F represent the group of formula

A, T, and n are as defined in claim 14, with
(b) an ethylenically unsaturated monocarboxylic acid, in the presence of a catalyst and a polymerisation inhibitor, at elevated temperature.

22. A method according to claim 20, wherein at least 20–100 mol % of the radicals M that are not present in the end groups Q and L of formula III are a group of the formula

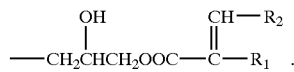

23. A method according to claim 20 or 21, wherein A and T are each independently of the other a linking group of the formulae

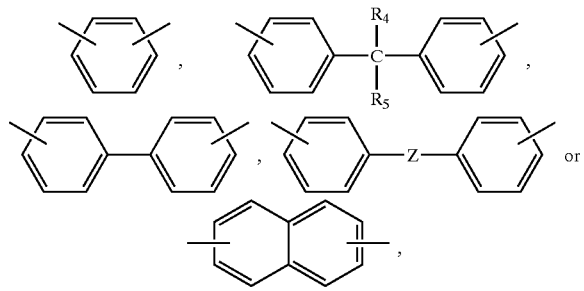

in which $R_4$ and $R_5$ are each independently of the other —H or $C_1$–$C_4$ alkyl; Z is —S—, —O—, or —$SO_2$—; and the phenyl radicals of said linking groups are unsubstituted or substituted by halogen or $C_1$–$C_4$ alkyl.

24. A method according to claim 20 or 21, wherein A and T are each independently of the other a linking group of formula

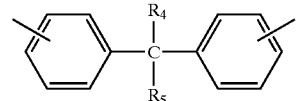

wherein $R_4$ and $R_5$ are each independently of the other —H or $C_1$–$C_4$ alkyl, and the phenyl radicals of said linking group are unsubstituted or bromine-substituted.

25. A method according to claim 24, wherein n is an integer from 0 to 50.

26. A method according to claim 24, wherein A and T are each independently of the other a linking group of formulae

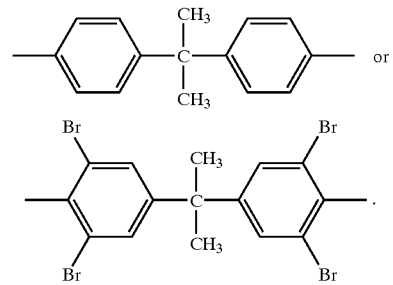

27. A method according to claim 21, wherein the ethylenically unsaturated monocarboxylic acid has the formula

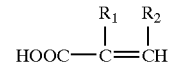

wherein $R_1$ and $R_2$ are defined as in claim 21.

28. A method according to claim 21, wherein the ethylenically unsaturated monocarboxylic acid is selected from the group consisting of crotonic acid, cinnamic acid, acrylic acid, methacrylic acid, and mixtures of any of the foregoing.

29. A method according to claim 28, wherein the ethylenically unsaturated monocarboxylic acid is selected from the group consisting of acrylic acid, methacrylic acid, and mixtures thereof.

30. A method according to claim 21, wherein said catalyst is selected from the group consisting of metal salts, amines, ammonium salts, triphenylphosphine and triphenylbismuth.

31. A method according to claim 30, wherein said catalyst is selected from the group consisting of chromium salts, triethylamine, benzyldimethylamine, and benzyltrimethylammonium chloride.

32. A method according to claim 21, wherein an inert solvent is used in the reaction and said solvent is selected from the group consisting of ketones, esters, ethers, aromatic hydrocarbons, and mixtures thereof.

33. A method according to claim 32, wherein the inert solvent is selected from the group consisting of acetone, methyl ethyl ketone, cyclohexanone, ethyl acetate, butyl acetate, ethoxyethyl acetate, methoxypropyl acetate, dimethoxyethane, dioxane, toluene, benzene, xylenes and mixtures of the foregoing.

34. A method according to claim 21, wherein the elevated temperature is in the range from 80 to 140° C.

35. A method according to claim 21, wherein the polymerisation inhibitor is selected from the group consisting of hydroquinone, hydroquinone monomethyl ether, and 2,6-di-tert-butyl-p-cresol.

36. A method according to claim 21, wherein air, or a mixture of nitrogen and oxygen, is introduced into the reaction medium.

37. A method according to claim 21, wherein the ethylenically unsaturated monocarboxylic acid is used in equimolar amounts with respect to the epoxy groups, or in less than equivalent amount.

38. A method according to claim 20, wherein the photoinitiator is 2-methyl-1-[4-(methylthio)phenyl]-2-morpholino-propane-1.

* * * * *